(12) United States Patent
Meyer-Güldner et al.

(10) Patent No.: US 6,922,344 B2
(45) Date of Patent: Jul. 26, 2005

(54) DEVICE FOR CONNECTING THE TERMINAL PINS OF A PACKAGE FOR AN OPTICAL TRANSMITTING AND/OR RECEIVING DEVICE TO A PRINTED CIRCUIT BOARD AND CONDUCTOR ARRANGEMENT FOR SUCH A DEVICE

(75) Inventors: Frank Meyer-Güldner, Berlin (DE); Daniel Reznik, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/642,545

(22) Filed: Aug. 15, 2003

(65) Prior Publication Data

US 2005/0035443 A1 Feb. 17, 2005

(51) Int. Cl.$^7$ ............................. H01R 9/00; H01L 23/48
(52) U.S. Cl. ....................... 361/772; 361/736; 361/737; 361/776; 361/777; 257/697; 257/700; 257/734; 439/76.1; 439/76.2
(58) Field of Search ................................. 361/736, 737, 361/700, 772, 776, 777; 257/697, 700, 99–100, 734; 439/66, 76.1–2; 174/261; 365/200; 385/92, 53, 56, 59

(56) References Cited

U.S. PATENT DOCUMENTS 6,781,727 B2 * 8/2004 Auracher et al. ........... 398/163
2002/0181522 A1 * 12/2002 Rookes et al. ........... 372/38.02

FOREIGN PATENT DOCUMENTS

DE 100 64 577 A1 7/2002

* cited by examiner

Primary Examiner—Donghee Kang
(74) Attorney, Agent, or Firm—Laurence A. Greenberg; Werner H. Stemer; Ralph E. Locher

(57) ABSTRACT

The device has a package with a base plate, and at least two terminal pins perpendicularly protruding from the base plate of the package. At least one of the terminal pins is a high-frequency terminal pin that transmits a high-frequency signal. The device has a flexible conductor arrangement with a plurality of interconnects. The conductor arrangement provides an electrical connection between the terminal pins of the package and electrical contacts of a printed circuit board. The conductor arrangement has contact regions for electrically connecting the interconnects to a terminal pin and to a contact of a printed circuit board. At least the region of the conductor arrangement that provides a connection to high-frequency terminal pin lies in a plane aligned substantially perpendicular to the plane of the base plate.

15 Claims, 4 Drawing Sheets

DEVICE FOR CONNECTING THE TERMINAL PINS OF A PACKAGE FOR AN OPTICAL TRANSMITTING AND/OR RECEIVING DEVICE TO A PRINTED CIRCUIT BOARD AND CONDUCTOR ARRANGEMENT FOR SUCH A DEVICE

BACKGROUND OF THE INVENTION

The invention relates to a device for connecting the terminal pins of a package for an optical transmitting and/or receiving device to a printed circuit board and to a conductor arrangement for such a device. In particular, the invention relates to the electrical connection of the terminal pins of a standard TO package for an optical transmitting and/or receiving device to a printed circuit board using a flexible conductor of a specific type of design.

FIELD OF THE INVENTION

It is known from DE 100 64 577 A1 to solder the terminal pins of a TO package which contains an optical transmitting and/or receiving device directly to a printed circuit board. Since both the printed circuit board and the TO package are fixed in a common housing (usually a transceiver housing), inadmissibly high mechanical stresses can occur, however, at the soldering points due to mechanical tolerances and thermal expansion.

Furthermore, it is known to connect the terminal pins of a TO package with a flexible conductor. Flexible conductors are arrangements known in the prior art in which interconnects have been applied to one, both or several sides of a flexible, insulating substrate. The connection between the terminal pins of a TO package and a flexible conductor takes place by means of via holes in the flexible conductor, through which the terminal pins are inserted. On account of mechanical tolerances, the via holes are in this case generally twice the diameter of the terminal pins. This gives rise to the problem that impedance matching to the impedance of the transmitting and/or receiving device or to the impedance of the terminal pins can only be accomplished with difficulty at the contact pad, in particular in the case of high frequencies in the range of 10 Gbits/s and higher. If the TO package is connected to ground or some other reference potential, adequately good ground contacting can also only be accomplished with difficulty, since, on account of the temperature sensitivity of the components, it is not possible for the TO base plate to be soldered over a surface area to establish the ground contacting.

SUMMARY OF THE INVENTION

The present invention is based on the object of providing a device for connecting the terminal pins of a package for an optical transmitting and/or receiving device to a printed circuit board which permits optimum matching of the impedance in the connecting region to the terminal pins of the package. It is also intended that a high-frequency path which is as short as possible can be accomplished. Furthermore, a conductor arrangement for use in a device of this type is to be provided.

The present invention provides a device for connecting the terminal pins of a package for an optical transmitting and/or receiving device to a printed circuit board which has:
a package with a base plate,
at least two terminal pins, which respectively protrude perpendicularly from the base plate of the package, at least one of the terminal pins being a high-frequency terminal pin which transmits a high-frequency signal,
a flexible conductor arrangement with a plurality of interconnects, the conductor arrangement providing an electrical connection between the terminal pins of the package and electrical contacts of a printed circuit board, and
contact regions of the conductor arrangement for the electrical connection of the interconnects respectively on the one hand to a terminal pin and on the other hand to a contact of a printed circuit board,
at least that region of the conductor arrangement which provides a connection to the at least one high-frequency terminal pin lying in a plane which is aligned substantially perpendicularly to the plane of the base plate.

The solution according to the invention is consequently based on the idea of connecting the terminal pins of a package which are subjected to a high-frequency signal to contact regions of a conductor arrangement in such a way that the contact regions or the corresponding part of the conductor arrangement are mounted perpendicularly to the base plate of the package, i.e. in the axial direction of the terminal pins. Suitable choice of the size of the contact regions and of the thickness of the dielectric of the conductor arrangement allow optimum matching of the impedance of the contact pad to be achieved. In addition, the impedance can be matched by the shaping of a contacting plate arranged on the base plate of the package and protruding from the latter and also by the shaping of a ground layer of the conductor arrangement.

The connection of the high-frequency terminal pins of the package by means of contact regions of the conductor arrangement which are aligned in the axial direction of the terminal pins additionally provides a connection with favorable high-frequency properties, since there is a connection between the contact region and the terminal pin substantially over the entire length of the terminal pin. Good field matching between the terminal pins and the contact regions of the conductor arrangement is achieved, so that the HF properties are improved. At the same time, the contact regions of the conductor arrangement which are connected to a high-frequency terminal pin preferably have in each case an elongate form in the axial direction of the pins.

In a preferred configuration of the invention, it is provided that the conductor arrangement has a first part and a second part, which is movable in relation to said first part. The region of the conductor arrangement which provides a connection to the at least one high-frequency terminal pin is in this case provided by the first part of the conductor arrangement. The second part on the other hand has interconnects for low-frequency signals. The separation of the conductor arrangement into two regions which are movable in relation to each other makes it possible to route the interconnects with high-frequency signals in a different way and to couple them differently to the package. These HF interconnects can also be made shorter, which further increases the HF performance.

In one development of the invention, it is provided that the base plate of the package is formed in an electrically conducting manner, one or more contacting elements protrude from the base plate of the package perpendicularly to the latter and the first part of the conductor arrangement has a contact region which is connected to a reference potential and is connected to the contacting element or the contacting elements. This allows the base plate to be connected in an effective way to ground or a positive operating voltage. The contacting element or the contacting elements is or are, for example, a contact plate or one or more contact pins.

In this case, the contact region which is connected to a reference potential is preferably arranged on a side of the conductor arrangement which is opposite from the side which has the contact regions connected to the high-frequency terminals. This has the effect that, in the region adjacent to the base plate of the package, the first part of the conductor arrangement runs between at least one high-frequency terminal pin and the contacting plate, or is pushed into this region.

The shaping of the conductor arrangement is preferably such that the first and the second part of the conductor arrangement are bent differently in the direction of the package, starting from a common end region which serves for the contacting of an assigned printed circuit board. In this case, the second part of the conductor arrangement preferably forms two bent lateral arms, of which preferably one in each case runs to the side of the first part of the conductor arrangement. The ends of the two arms facing the bottom region are connected to each other by a transverse region running substantially perpendicularly to the arms. On this transverse region there are preferably the contact regions for the contacting of further terminal pins. The two arms of the second part are preferably bent in a U-shaped manner. This configuration has the advantage that a certain flexibility and spring force of the arrangement is provided by the arms.

In one configuration it is provided that the transverse region of the second part of the conductor arrangement runs parallel to the base plate. The connection to the corresponding pins of the package then takes place by means of via holes. Alternatively, however, the second part in the region of the connection to the pins may also have the same orientation as the first part, i.e. run perpendicularly to the base plate.

In one development, a thermistor is arranged in an effective and space-saving way on the transverse region of the conductor arrangement on the side facing the base plate and is pressed elastically against the base plate.

The conductor arrangement according to the invention has:
- a number of interconnects on a flexible dielectric,
- a first part, which contains at least one interconnect for a high-frequency signal;
- a second part, which is movable in relation to the first part and contains at least one interconnect for a low-frequency signal,
- the two parts being bent in different ways, starting from a common end.

Figure 1:
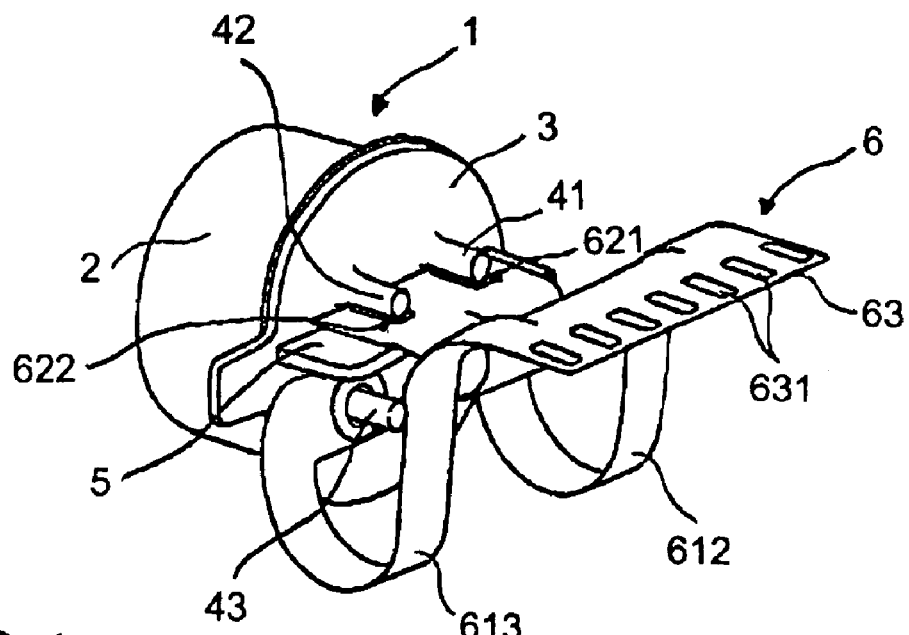
FIG. 1 is a perspective view of a device having a TO package with a number of terminal pins protruding from the base plate of the TO package and a conductor arrangement for contacting the terminal pins.
Figure 2:
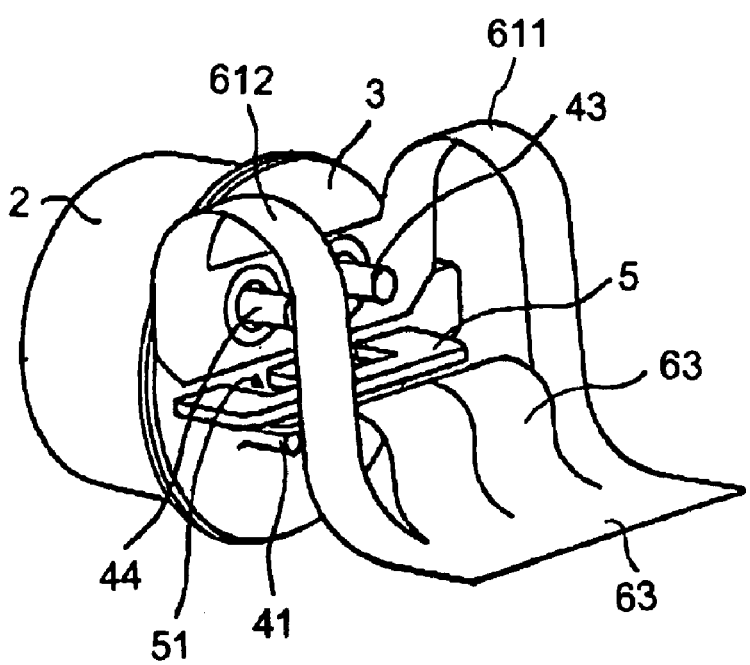
FIG. 2 is a perspective view of the device of FIG. 1 turned through 180°.

DESCRIPTION OF THE PREFERRED EMBODIMENTS:

FIGS. 1 and 2 show a connecting device for the connection of the terminal pins of a TO package to a printed circuit board (not represented).

TO packages are individual packages for receiving optoelectronic components such as an optical transmitting module and/or an optical receiving module. TO packages are known per se in the prior art and their actual configuration is not relevant in the context of the present invention. The TO package 1 comprises a conducting, metallic base plate 3, in which a plurality of electrical terminal pins 41, 42, 43, 44 are provided by glazing. A cap 2 is placed onto the base plate 3. A glass window is soldered in the cap 2, in order to provide an optical passage.

There are known optical devices in which a laser diode chip or a photodiode chip which is operated at a modulation frequency of 10 Gbits/s is arranged in a TO package. One problem which arises in this case is the electrical connection of the TO package to a printed circuit board, the TO package and the printed circuit board generally being arranged together in an optical transceiver. In actual fact, an electrical connection is respectively to be realized between one of the terminal pins 41, 42, 43, 44 of the TO package and an assigned terminal pad of an assigned printed circuit board. Components for operating the transmitting and/or receiving device, such as driver modules and/or control ICs, are in this case arranged on the printed circuit board.

For the electrical contacting, a conductor arrangement 6 of a special type of design is provided in the present case.

The conductor arrangement 6 represents what is known as a flexible conductor, which has a plurality of interconnects which are arranged in a flexible dielectric. The conductor arrangement 6—also referred to hereafter as a flexible conductor—has an end region 63, which serves for the connection to a printed circuit board (not represented). Arranged for this purpose on the one surface of the end region 63 are a multiplicity of contact pads 631, by means of which an electrical connection with corresponding contact pads on a printed circuit board can be established.

Starting from the end region 63, the flexible conductor fans out into two subregions, namely a first central part 61 and a second, outer part 62, which are of different lengths and different shapes. As can also be seen from FIG. 5, the flexible conductor has in this case a first, central part 62 and a second, outer part 61. The central part 62 is of a relatively small length and serves for the contacting of those terminal pins of the base plate which are subjected to a high-frequency signal. These are generally two of the four terminal pins 41 to 44 represented in FIGS. 1 and 2. In the exemplary embodiment presented, the terminal pins 41, 42 are subjected to a high-frequency signal. This is constituted, for example, by the two components of a differential driver signal or the outputs of a preamplifier coupled to a photodiode.

The first part 62 of the flexible conductor is aligned in such a way that mounting takes place perpendicularly to the TO base plate 3 or in the direction of the axis of the terminal pins 41, 42. The connection takes place by soldering longitudinally extending terminal pads 621, 622 to the terminal pins 41, 42.

It should be pointed out that, in the exemplary embodiment of FIG. 1, the base plate of the TO package 1 is connected to ground. The contacting plate or ground plate 5, which protrudes perpendicularly from the base plate 3, is provided for the corresponding contacting.

Figure 5:
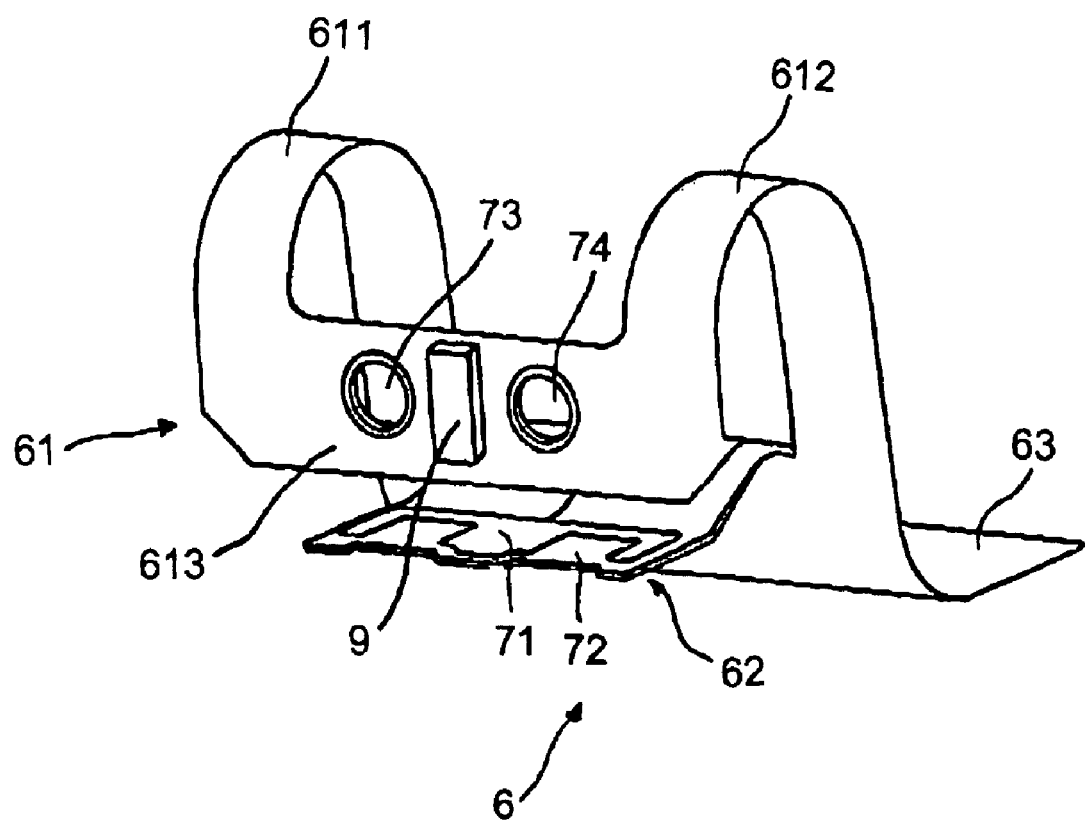
FIG. 5 is a perspective view of the conductor arrangement of FIGS. 1 and 2.

As represented in FIG. 5, located on the other side of the part 62 of the flexible conductor is a large-area ground contact 71, by means of which a connection to the ground plate 5 is established. The end region of the part 62 is consequently pushed to a certain extent between the terminal pins 41, 42 and the ground plate: the contact pads 621, 622 contact the terminal pins 41, 42, and the ground contact 71, arranged on the rear side in relation thereto, contacts the ground plate 5 on the other side.

The second part 61 of the flexible conductor 6 is split with respect to the first part and movable flexibly with respect to it. Starting from the common region 63, it has two lateral arms 611, 612, which are bent in a U-shaped manner, and a transverse region 613, which runs between the ends of the arms and in which via holes 73, 74 are located for the electrical contacting with respect to the further, low-frequency terminal pins 43, 44 of the TO package.

Also located on the side of the transverse region 613 facing the base plate 3 is a thermistor 9, which is required for the temperature control of a laser driver current and is pressed by the flexible conductor 61 elastically against the TO base plate 3, so that a very good thermal connection exists with respect to the heat source, i.e. with respect to a laser chip arranged on the base plate 3. To improve this thermal connection, a heat conducting paste or a conducting adhesive (not represented) may be additionally applied between the thermistor 9 and the TO base plate 3.

In this case, a flexible spring force is provided by the U-shaped bent arms 611, 612 for pressing the thermistor 9 against the base plate 3.

It is pointed out that the configuration of the flexible conductor 6 in the figures is to be understood as given only by way of example. For example, the use of a thermistor 9 is only optional. Furthermore, as a departure from the representation of FIG. 5 and in a way similar to the first subregion 62, the second subregion 61 may also be oriented in its contacting region or transverse region 613 in an alignment perpendicular to the base plate, so that an electrical connection takes place in a way corresponding to that of the terminal pins 41, 42.

Figure 4:
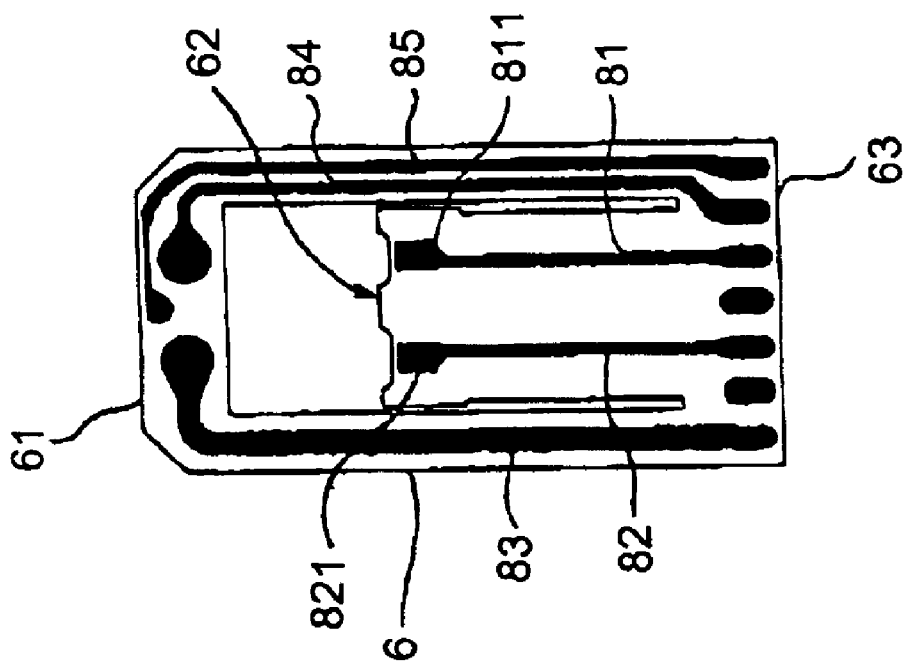
FIG. 4 is a view of the high-frequency side of the conductor arrangement of FIG. 3.
Figure 3:
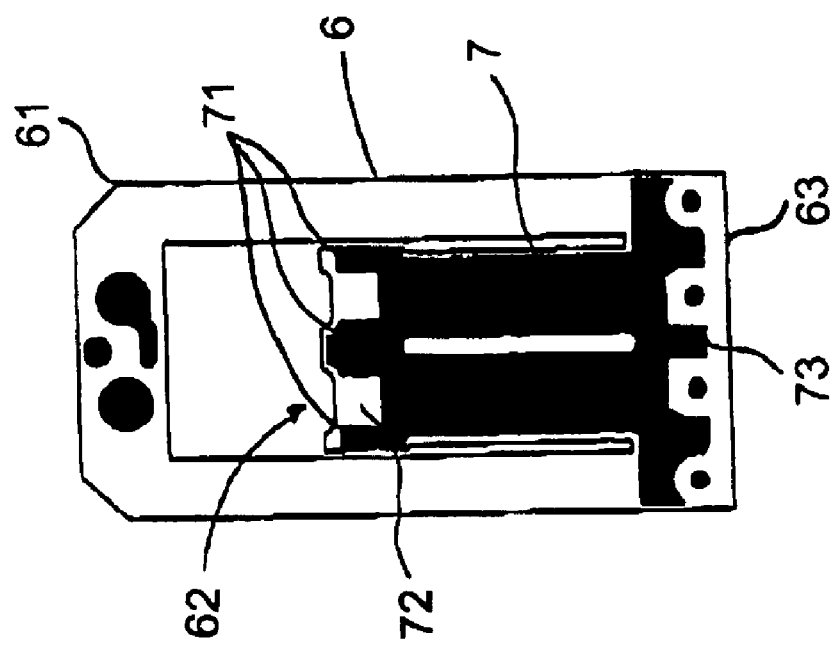
FIG. 3 is a view of the ground layer of the conductor arrangement of FIGS. 1 and 2.

The electrical contacts and interconnects of the flexible conductor 6 are represented in FIGS. 3 and 4. FIG. 3 shows in this case the one (lower) side of the flexible conductor 6, FIG. 4 shows the opposite (upper) side of the flexible conductor 6. Located in between is a flexible dielectric of a specific thickness. It should be noted at this point that the flexible conductor 6 has a planar form, i.e. the thickness is small in comparison with the longitudinal extent and lateral extent. In the common end region 63, in which the contacts 631 for the connection to a printed circuit board are arranged, the interconnects run in one plane.

The ground layer 7, arranged on the underside, is connected through a via hole 73 to one of the terminal pads 631. The ground layer 7 extends substantially on the entire underside of the first part 62 of the flexible conductor and ends in the ground contact 71, which is also represented in FIG. 5 and by means of which a connection to the ground plate 5 of the TO package takes place.

The upper side, represented in FIG. 4, has two central interconnects 81, 82 for the HF paths. The HF interconnects 81, 82 run in the first part 62 of the flexible conductor. They are of a relatively small length, in order as far as possible to form no parasitic inductances. Their end regions 811, 821, facing the TO base plate 3, are connected to the contact pads 621, 622 according to FIG. 1, or merge with them.

Further interconnects 83, 84, 85 serve for the connection of low-frequency signals. For example, contacting of the thermistor 9 takes place by means of the interconnect 85. The interconnects 83, 84 may be provided, for example, for a bias current for a laser diode and the signal of a monitor diode, with other low-frequency contacts also being conceivable.

By suitable choice of the size of the terminal pads 621, 622, the thickness of the dielectric of the flexible conductor 63 and, if appropriate, additionally by suitable forming of the ground area 7 of the flexible conductor, the present arrangement permits optimum matching of the impedance of the interconnects to the impedance of the following signal path.

In this connection it is pointed out that, according to FIG. 2, it may be provided that clearances 51 by which impedance matching can be optimized are contained in the ground plate 5. Similarly, the ground layer 7 of the flexible conductor according to FIGS. 3 and 5 has clearances 72 between individual arms of the ground contact 71. In other applications, however, it is also quite possible for a continuous ground plate to be used, or a continuous ground contact 71.

The connection of the low-frequency terminal pins 43, 44 takes place as already explained through via holes 73, 74 in the transverse region 613 of the second part 61 of the flexible conductor 6. This part 613 may in this case alternatively also be connected parallel to the TO terminal pins, in a way similar to the first part 62, whereby the flexible conductor would, however, have a higher degree of rigidity.

The actual connection of the TO terminal pins 41–44 to the pads 621, 622 or the via holes 73, 74 respectively takes place by means of a soldered connection, and so does the connection of the ground plate 5 to the ground contacting 71. It is pointed out that the actual interconnects cannot be seen in FIGS. 1, 2 and 5, since in the configuration presented they are covered by solder resist.

Together with the parallel arrangement of the HF part 62 of the flexible conductor in relation to the HF terminal pins in the connecting region, the "splitting" of the flexible conductor into two parts 61, 62 which are movable in relation to each other permits optimum connection of the HF terminal pins to the flexible conductor.

Figure 6:
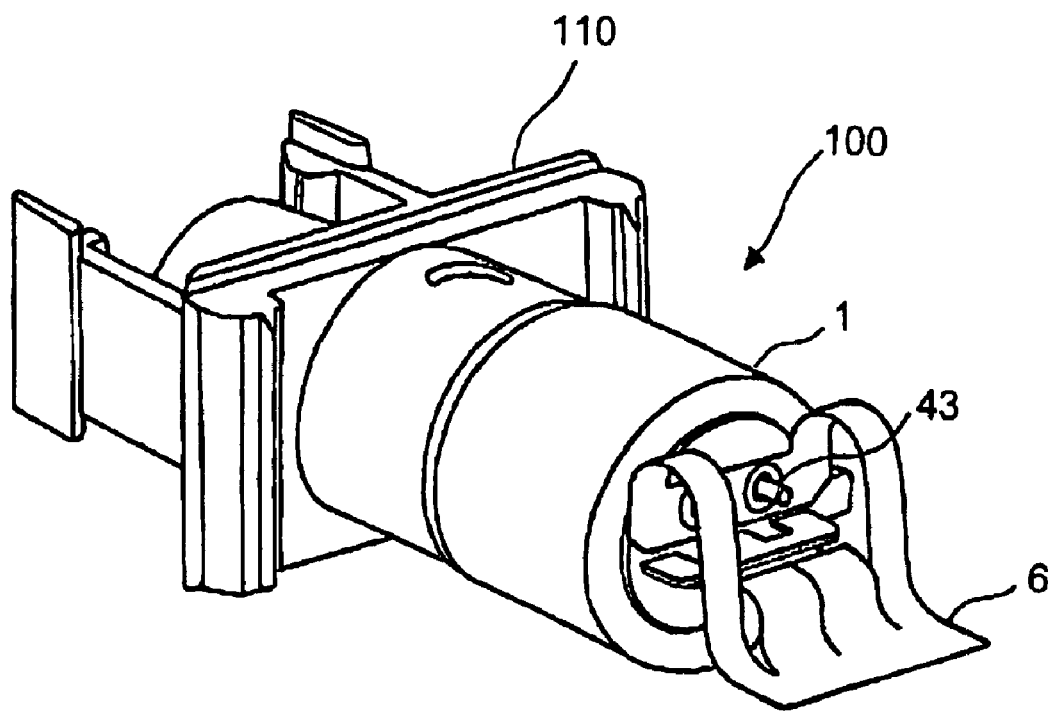
FIG. 6 is a view of an electro-optical transducer with a connecting device according to FIG. 1 and 2.

FIG. 6 shows a complete electro-optical transducer 100, which can be connected by means of the flexible conductor 6 to a printed circuit board (not represented). The TO package 1 is followed by a plug unit for an optical plug 110, with a plug unit for an SC plug (SC=subscriber connector) being represented in the exemplary embodiment presented.

The invention is not restricted in its implementation to the exemplary embodiment presented above, which is to be understood as merely given by way of example. A person skilled in the art appreciates that there are numerous alternative configurational variants which, though deviating from the exemplary embodiment described, make use of the teaching defined in the claims which follow.

We claim:

1. A configuration for connecting to electrical contacts of a printed circuit board, the configuration comprising:

a package having a base plate extending in a plane;

at least two terminal pins protruding perpendicularly from said base plate of said package, at least one of said terminal pins being a high-frequency terminal pin for transmitting a high-frequency signal;

a flexible conductor configuration including a plurality of interconnects, said conductor configuration for providing an electrical connection between said terminal pins protruding from said package and the electrical contacts of the printed circuit board;

said conductor configuration including a plurality of contact regions for electrically connecting each of said plurality of interconnects to a respective one of said terminal pins and to a respective one of the electrical contacts of the printed circuit board;

said conductor configuration including at least one region lying in a plane aligned substantially perpendicularly to said plane of said base plate; and said region of said conductor configuration providing a connection to said high-frequency terminal pin.

2. The configuration according to claim 1, wherein:

said terminal pins extend in an axial direction;

said plurality of contact regions include an elongate contact region that is connected to said high-frequency terminal pin; and said elongate contact region extends along said axial direction of said terminal pins.

3. The configuration according to 1, wherein:

said conductor configuration includes a first part and a second part that is movable in relation to said first part;

said region of said conductor configuration is formed by said first part of said conductor configuration; and said second part of said conductor configuration includes a plurality of interconnects for low-frequency signals.

4. The configuration according to claim 3, further comprising:

two high-frequency terminal pins for transmitting high-frequency signals, said two high-frequency terminal pins being ones of said at least two terminal pins;

said first part of said conductor configuration having two contact regions contacting said two high-frequency terminal pins.

5. The configuration according to claim 3, further comprising:

at least one contacting element protruding perpendicularly from said base plate of said package;

said base plate of said package formed in an electrically conducting manner; and said first part of said conductor configuration having a contact region connected to a reference potential and to said contacting element.

6. The configuration according to claim 5, further comprising:

a contacting plate protruding perpendicularly from said base plate; and two high-frequency terminal pins for transmitting high-frequency signals, said two high-frequency terminal pins being ones of said at least two terminal pins;

said first part of said conductor configuration having two contact regions contacting said two high-frequency terminal pins;

said conductor configuration having a first side configured with said contact region connected to the reference potential and to said contacting element;

said conductor configuration having a second side configured with said two contact regions contacting said two high-frequency terminal pins;

said second side of said conductor configuration being opposite said first side of said conductor configuration; and said conductor configuration having a region adjacent said base plate in which said first part of said conductor configuration runs between at least one of said two high-frequency terminal pins and said contacting plate.

7. The configuration according to claim 3, wherein:

said conductor configuration has a common end region for contacting the printed circuit board; and said first part of said conductor configuration and said second part of said conductor configuration are bent differently towards said package, starting from said common end region.

8. The configuration according to claim 7, wherein:

said first part of said conductor configuration has two sides;

said second part of said conductor configuration includes two bent lateral arms having ends;

each one of said two arms runs along a respective one of said two sides of said first part of said conductor configuration;

said second part of said conductor configuration includes a transverse region running substantially perpendicularly to said two arms and connecting said ends of said two arms;

said at least two terminal pins includes further terminal pins; and said transverse region includes a plurality of contact regions for contacting said further terminal pins.

9. The configuration according to claim 8, wherein said transverse region of said conductor configuration is oriented parallel to said base plate.

10. The configuration according to claim 8, further comprising:

a thermistor pressed elastically against said base plate;

said transverse region of said conductor configuration having a side facing said base plate; and said thermistor configured on said transverse region of said conductor configuration on said side facing said base plate.

11. The configuration according to claim 8, wherein said two arms of said second part are bent in a U-shaped manner.

12. The configuration according to claim 3, wherein said second part of said conductor configuration includes a plurality of contact regions formed as via holes.

13. The configuration according to claim 3, wherein:

said conductor configuration has a common end region for contacting the printed circuit board;

said first part of said conductor configuration and said second part of said conductor configuration are bent differently towards said package, starting from said common end region;

said plurality of interconnects of said second part have a length; and said first part of said conductor configuration has a plurality of interconnects with a length being shorter than said length of said plurality of interconnects of said second part.

14. The configuration according to claim 1, wherein:

said conductor configuration has a surface;

said conductor configuration is planar; and one of said plurality of contact regions is an elongate contact pad formed on said surface of said conductor configuration and is connected to said high-frequency terminal pin.

15. The configuration according to claim 1, wherein said plurality of contact regions are soldered to said terminal pins.

* * * * *